United States Patent
Lin et al.

(10) Patent No.: US 11,749,719 B2
(45) Date of Patent: Sep. 5, 2023

(54) SOURCE/DRAIN FEATURES

(71) Applicant: Taiwan Semiconductor Manufacturing Company, Ltd., Hsinchu (TW)

(72) Inventors: Ruei-Ping Lin, Hsinchu (TW); Kai-Di Tzeng, Hsinchu (TW); Chen-Ming Lee, Taoyuan County (TW); Wei-Yang Lee, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/859,909

(22) Filed: Jul. 7, 2022

(65) Prior Publication Data
US 2022/0344472 A1 Oct. 27, 2022

Related U.S. Application Data

(63) Continuation of application No. 17/100,543, filed on Nov. 20, 2020, now Pat. No. 11,398,553.

(51) Int. Cl.
H01L 29/10 (2006.01)
H01L 29/78 (2006.01)
(Continued)

(52) U.S. Cl.
CPC ...... *H01L 29/1033* (2013.01); *H01L 29/0673* (2013.01); *H01L 29/42392* (2013.01);
(Continued)

(58) Field of Classification Search
CPC ............. H01L 29/1033; H01L 29/6656; H01L 29/6681; H01L 29/66818; H01L 29/7851;
(Continued)

(56) References Cited

U.S. PATENT DOCUMENTS 11,171,136 B2 * 11/2021 Kim ...................... H01L 29/161
2014/0151639 A1 * 6/2014 Chang ................ H01L 29/0673
257/27
(Continued)

FOREIGN PATENT DOCUMENTS

WO 2020065732 A1 4/2020
WO WO-2020065732 A1 * 4/2020 .......... H01L 27/1104

OTHER PUBLICATIONS

Liao, Yi-Bo, et al., "Source/Drain Contact Structure", U.S. Appl. No. 17/093,230, filed Nov. 9, 2020, Assignee: Taiwan Semiconductor Manufacturing Co., Ltd., 50 pages specification, 57 pages drawings.
(Continued)

*Primary Examiner* — Earl N Taylor
(74) *Attorney, Agent, or Firm* — HAYNES AND BOONE, LLP

(57) ABSTRACT

A semiconductor structure and a method of forming the same are provided. In an embodiment, a semiconductor structure includes a first plurality of channel members over a backside dielectric layer, a second plurality of channel members over the backside dielectric layer, a first gate structure over and wrapping around each of the first plurality of channel members, a second gate structure over and wrapping around each of the second plurality of channel members, and a through-substrate contact that extends between the first plurality of channel members and the second plurality of channel members, between the first gate structure and the second gate structure, and through the backside dielectric layer.

20 Claims, 16 Drawing Sheets

(51) Int. Cl.
  *H01L 29/66* (2006.01)
  *H01L 29/775* (2006.01)
  *H01L 29/423* (2006.01)
  *H01L 29/786* (2006.01)
  *H01L 29/06* (2006.01)

(52) U.S. Cl.
  CPC ...... *H01L 29/6656* (2013.01); *H01L 29/6681* (2013.01); *H01L 29/66439* (2013.01); *H01L 29/66545* (2013.01); *H01L 29/66818* (2013.01); *H01L 29/775* (2013.01); *H01L 29/7851* (2013.01); *H01L 29/7855* (2013.01); *H01L 29/78696* (2013.01); *H01L 2029/7858* (2013.01)

(58) Field of Classification Search
  CPC ......... H01L 29/7855; H01L 2029/7858; H01L 29/42392; H01L 23/5226; H01L 23/528; H01L 23/535
  See application file for complete search history.

(56) References Cited

U.S. PATENT DOCUMENTS

| | | | | |
|---|---|---|---|---|
| 2017/0092541 | A1* | 3/2017 | Or-Bach | H01L 27/0688 |
| 2019/0131394 | A1* | 5/2019 | Reznicek | H01L 21/30604 |
| 2019/0131395 | A1* | 5/2019 | Lee | H01L 29/0653 |
| 2019/0237461 | A1* | 8/2019 | Or-Bach | H10B 41/20 |
| 2020/0091348 | A1* | 3/2020 | Guha | H01L 29/78651 |
| 2020/0105759 | A1* | 4/2020 | Bowonder | H01L 21/823871 |
| 2020/0294998 | A1* | 9/2020 | Lilak | H01L 23/53295 |
| 2020/0365583 | A1* | 11/2020 | Or-Bach | H10B 20/00 |
| 2021/0028112 | A1* | 1/2021 | Kim | H01L 21/76843 |
| 2021/0035975 | A1* | 2/2021 | Kim | H01L 21/823418 |

OTHER PUBLICATIONS

Lung-Kun Chu, et al., "Self-Aligned Backside Source Contact Structure", U.S. Appl. No. 17/016,109, filed Sep. 9, 2020, Assignee: Taiwan Semiconductor Manufacturing Co. Ltd., 31 pages specification, 17 pages drawings.

Huan-Chieh Su, et al., "Backside Power Rail and Methods of Forming the Same", U.S. Appl. No. 16/901,963, Attorney Docket No. 2019-4205/24061.4155US01, Assignee: Taiwan Semiconductor Manufacturing Co., Ltd., 29 pages specification, 22 pages drawings.

Pei-Wei Wang, et al., "Method of Forming Backside Power Rails", U.S. Appl. No. 17/037,274, Assignee: Taiwan Semiconductor Manufacturing Company, Ltd., 29 pages specification, 16 pages drawings.

* cited by examiner

SOURCE/DRAIN FEATURES

PRIORITY DATA

This application is a continuation of U.S. patent application Ser. No. 17/100,543, filed Nov. 20, 2020, which is hereby incorporated herein by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, as integrated circuit (IC) technologies progress towards smaller technology nodes, multi-gate devices have been introduced to improve gate control by increasing gate-channel coupling, reducing off-state current, and reducing short-channel effects (SCEs). A multi-gate device generally refers to a device having a gate structure, or portion thereof, disposed over more than one side of a channel region. Fin-like field effect transistors (FinFETs) and multi-bridge-channel (MBC) transistors are examples of multi-gate devices that have become popular and promising candidates for high performance and low leakage applications. A FinFET has an elevated channel wrapped by a gate on more than one side (for example, the gate wraps a top and sidewalls of a "fin" of semiconductor material extending from a substrate). An MBC transistor has a gate structure that can extend, partially or fully, around a channel region to provide access to the channel region on two or more sides. Because its gate structure surrounds the channel regions, an MBC transistor may also be referred to as a surrounding gate transistor (SGT) or a gate-all-around (GAA) transistor. The channel region of an MBC transistor may be formed from nanowires, nanosheets, other nanostructures, and/or other suitable structures. The shapes of the channel region have also given an MBC transistor alternative names such as a nanosheet transistor or a nanowire transistor.

As the dimensions of the multi-gate devices shrink, packing all contact features on one side of a substrate is becoming more and more challenging. To ease the packing density, it has been proposed to move some routing features, such as power lines (also referred to as power rails) to a backside of the substrate. Some processes for forming backside source/drain contacts may damage the source/drain features. Additionally, existing structures may not provide sufficient silicide contact areas. Therefore, while existing backside power rail formation processes may be generally adequate for their intended purposes, they are not satisfactory in all aspects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
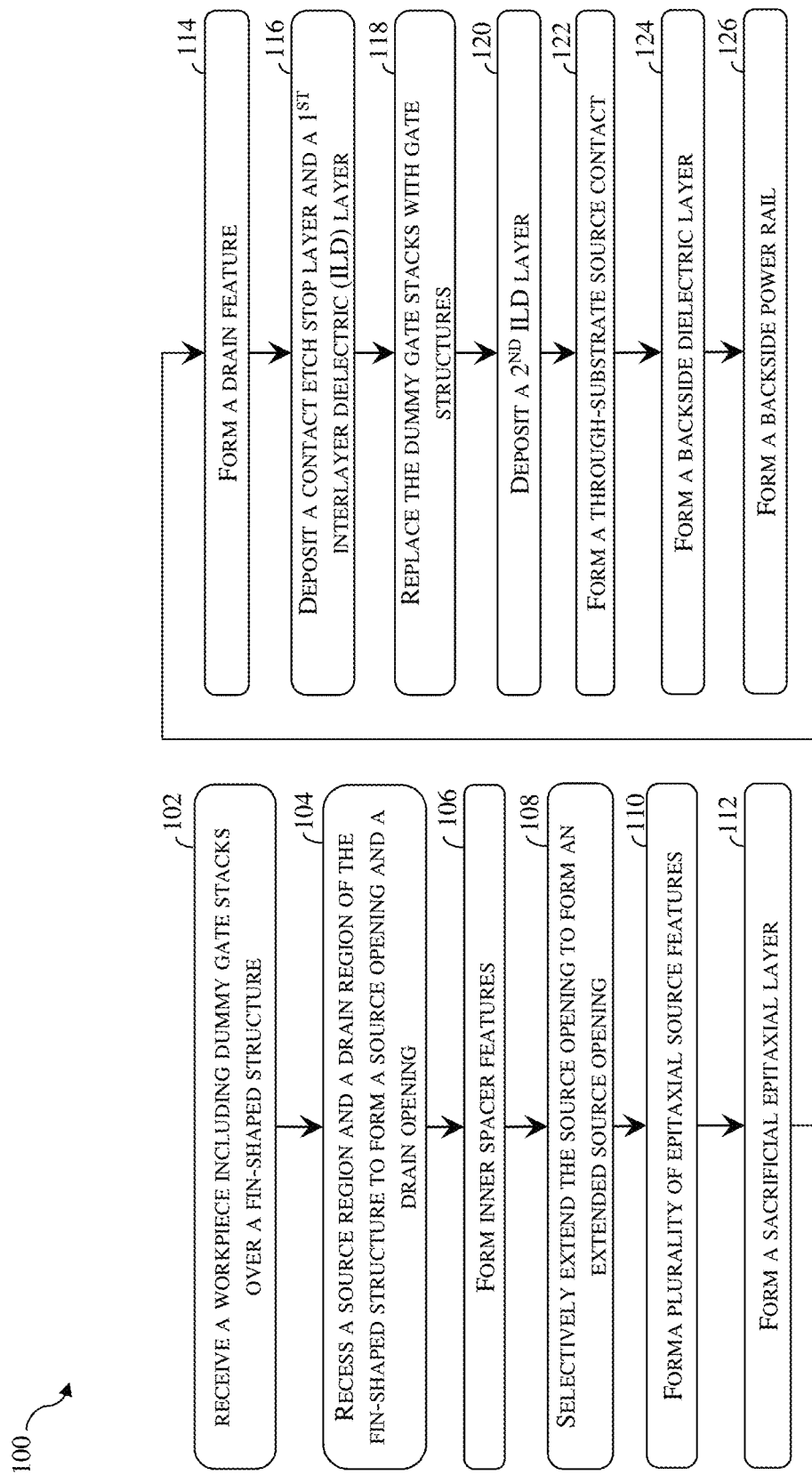
FIG. 1 illustrates a flow chart of a method for forming a semiconductor device having a backside power rail, according to one or more aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to methods of forming a semiconductor device having backside power rails, and more particularly to methods of forming a through-substrate source/drain contact.

Conventionally, source/drain contacts and gate contacts of transistors on a substrate connect source/drain features of the transistors to an interconnect structure over a front side of the substrate. As the dimensions of IC devices shrink, the close proximity among the source/drain contacts and gate contacts may reduce process windows for forming these contacts and may increase parasitic capacitance among them. The backside power rail (BPR) structure is a modern solution for performance boost on power delivery network (PDN) for advanced technology node and it eases the crowding of contacts. In some conventional processes, after a source/drain feature and a frontside source/drain contact are formed, the substrate is flipped over and a backside contact opening is etched from the back side of the substrate. Because the backside contact opening exposes the source/drain feature, the formation of the backside contact opening involves risks of damaging the source/drain feature and adjacent semiconductor structures. In addition, both the frontside source/drain contact and the backside source/drain contact interface the source/drain contact with a silicide layer. The area of the first silicide layer is largely limited by the contact openings.

The present disclosure provides a source/drain structure for MBC transistors. In an example structure, a first plurality of channel members and a second plurality of channel members are disposed over a backside dielectric layer. A first gate structure is disposed over and wraps around each of the first plurality of channel members. A second gate structure is disposed over and wraps around each of the second plurality of channel members. A through-substrate source/drain contact extends between the first plurality of channel members and the second plurality of channel members. The first plurality of channel members and the second plurality of channel members are disposed on a backside dielectric layer. The through-substrate source/drain contact also extends through the backside dielectric layer. The through-substrate source/drain contact is spaced apart from the first plurality of channel members and the second plurality of channel members by a plurality of epitaxial features. A metal silicide layer and an adhesion layer may also be disposed between the plurality of epitaxial features and the through-substrate source/drain contact. The plurality of epitaxial features are not subject to etching and their interface with the through-substrate source/drain contact reduces contact resistance.

The various aspects of the present disclosure will now be described in more detail with reference to the figures. In that regard, FIG. 1 is a flowchart illustrating method 100 of forming a semiconductor device according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-16, which are fragmentary cross-sectional views of a workpiece 200 at different stages of fabrication according to embodiments of method 100. Because the workpiece 200 will be fabricated into a semiconductor device 200 upon conclusion of the fabrication processes, the workpiece 200 may be referred to as the semiconductor device 200 as the context requires. Additionally, throughout the present application, like reference numerals denote like features, unless otherwise excepted.

Figure 2:
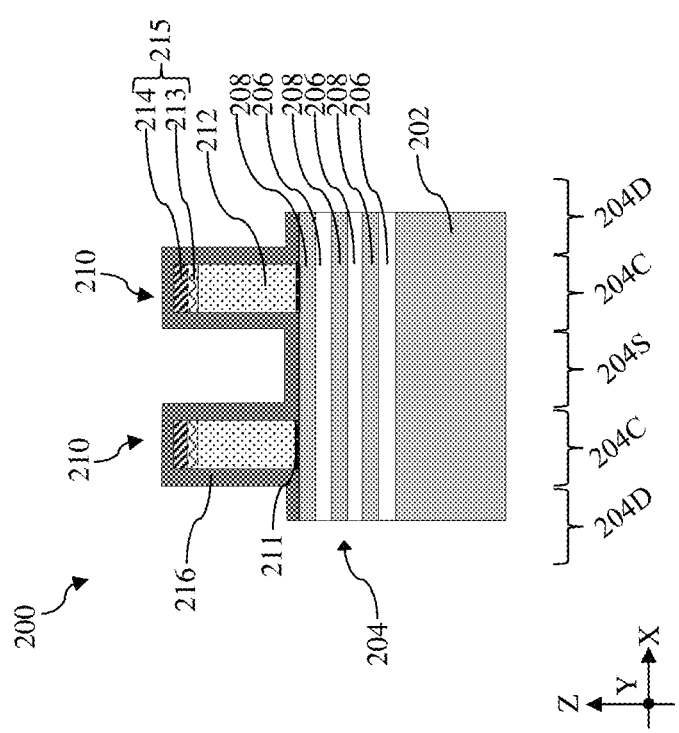
FIGS. 2-16 illustrate fragmentary cross-sectional views of a workpiece during a fabrication process according to the method of FIG. 1, according to one or more aspects of the present disclosure.

Referring to FIGS. 1 and 2, method 100 includes a block 102 where a workpiece 200 is received. In the depicted embodiment, the workpiece 200 includes a substrate 202 and a fin-shaped structure 204 disposed over the substrate 202. The fin-shaped structure 204 extends lengthwise along the X direction and is divided into channel regions 204C, source regions 204S, and drain regions 204D. In FIG. 2, the workpiece 200 also includes dummy gate stacks 210 disposed over channel regions 204C of the fin-shaped structure 204. Two dummy gate stacks 210 are shown in FIG. 2 but the workpiece 200 may include more dummy gate stacks 210. The substrate 202 may be a semiconductor substrate such as a silicon (Si) substrate. The substrate 202 may also include other semiconductor materials such as germanium (Ge), silicon carbide (SiC), silicon germanium (SiGe), or diamond. The fin-shaped structure 204 may be formed from a portion of the substrate 202 and a vertical stack of alternating semiconductor layers using a combination of lithography and etch steps. In some instances, the patterning of the fin-shaped structure 204 may be performed using double-patterning or multi-patterning processes to create patterns having pitches smaller than what is otherwise obtainable using a single, direct photolithography process. The etching process can include dry etching, wet etching, reactive ion etching (RIE), and/or other suitable processes. In the depicted embodiments, the vertical stack of alternating semiconductor layers may include a plurality of channel layers 208 and a plurality of sacrificial layers 206. The plurality of channel layers 208 are interleaved by the plurality of sacrificial layers 206. In some embodiments, the plurality of channel layers 208 may include silicon (Si) and the plurality of sacrificial layers 206 may be formed of silicon germanium (SiGe). The channel layers 208 and the sacrificial layers 206 may be epitaxially deposited on the substrate 202 using molecular beam epitaxy (MBE), vapor-phase epitaxy (VPE), ultra-high vacuum CVD (UHV-CVD), and/or other suitable epitaxial growth processes.

While not explicitly shown in FIG. 2, an isolation feature is also formed around the fin-shaped structure 204 to isolate the fin-shaped structure 204 from an adjacent fin-shaped structure. In some embodiments, the isolation feature is deposited in trenches that define the fin-shaped structure 204. Such trenches may extend through the channel layers 208 and sacrificial layers 206 and terminate in the substrate 202. The isolation feature may also be referred to as a shallow trench isolation (STI) feature. In an example process, a dielectric material for the isolation feature is deposited over the workpiece 200 using CVD, subatmospheric CVD (SACVD), flowable CVD, physical vapor deposition (PVD), spin-on coating, and/or other suitable process. Then the deposited dielectric material is planarized and recessed until the fin-shaped structure 204 rises above the isolation feature. The dielectric material for the isolation feature may include silicon oxide, silicon oxynitride, fluorine-doped silicate glass (FSG), a low-k dielectric, combinations thereof, and/or other suitable materials.

In some embodiments, a gate replacement process (or gate-last process) is adopted where the dummy gate stacks 210 serve as placeholders for functional gate structures. Other processes and configuration are possible. To form the dummy gate stacks 210, a dummy dielectric layer 211, a dummy gate electrode layer 212, and a gate-top hard mask layer 215 are deposited over the workpiece 200. The deposition of these layers may include use of low-pressure CVD (LPCVD), CVD, plasma-enhanced CVD (PECVD), PVD, thermal oxidation, e-beam evaporation, or other suitable deposition techniques, or combinations thereof. The dummy dielectric layer 211 may include silicon oxide. The dummy gate electrode layer 212 may include polysilicon. The gate-top hard mask layer 215 may be a multi-layer that includes a silicon oxide layer 213 and silicon nitride layer 214. Using photolithography and etching processes, the gate-top hard mask layer 215 is patterned. The photolithography process may include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. The etching process may include dry etching (e.g., RIE etching), wet etching, and/or other etching methods. Thereafter, using the patterned gate-top hard mask 215 as the etch mask, the dummy dielectric layer 211 and the dummy gate electrode layer 212 are then etched to form the dummy gate stack 210. As shown in FIG. 2, portions of the fin-shaped structure 204 underlying the dummy gate stacks 210 are channel region 204C. The channel regions 204C and the dummy gate stack 210 also define source regions 204S and drain regions 204D that are not vertically overlapped by the dummy gate stacks 210. Each of the channel regions 204C is disposed between a source region 204S and a drain region 204D along the X direction.

As shown in FIG. 2, the workpiece 200 also includes a gate spacer layer 216 disposed along sidewalls of the dummy gate stacks 210 and top surfaces of the fin-shaped structure 204. In some embodiments, the formation of the gate spacer layer 216 includes conformal deposition of one or more dielectric layers over the workpiece 200. In an example process, the one or more dielectric layers are deposited using CVD, SACVD, or ALD. The one or more dielectric layers may include silicon oxide, silicon nitride, silicon carbide, silicon oxynitride, silicon carbonitride, silicon oxycarbide, silicon oxycarbonitride, and/or combinations thereof.

Figure 3:
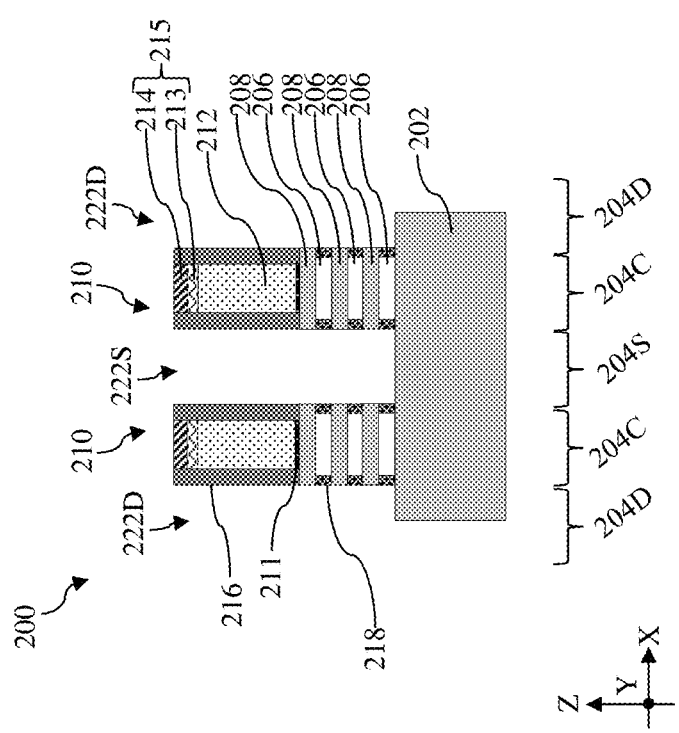

Referring to FIGS. 1 and 3, method 100 includes a block 104 where a source region 204S and a drain region 204D of the fin-shaped structure 204 are recessed to form a source opening 222S and a drain opening 222D. After the deposition of the gate spacer layer 216, the dummy gate stacks 210 and the gate spacer layer 216 along sidewalls of the dummy gate stacks serve as an etch mask in an etch process that anisotropically etches the source regions 204S and the drain regions 204D of the fin-shaped structure 204. The anisotropic etching of the source regions 204S and the drain regions 204D results in source openings 222S and drain openings 222D, respectively. The etch process at block 104 may be a dry etch process or a suitable etch process. An example dry etch process may implement an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas, other suitable gases and/or plasmas, and/or combinations thereof. In embodiments represented in FIG. 3, the source openings 222S and the drain openings 222D extend through vertical stack of semiconductor layers (including channel layers 208 and sacrificial layers 206). In some implementations not explicitly shown, the source openings 222S and the drain openings 222D may partially extend into the substrate 202. Sidewalls of the channel layers 208 and the sacrificial layers 206 are exposed in the source openings 222S and the drain openings 222D.

Referring to FIGS. 1 and 3, method 100 includes a block 106 where inner spacer features 218 are formed. After the formation of the source openings 222S and the drain openings 222D, the sacrificial layers 206 exposed in the source openings 222S and the drain openings 222D are selectively and partially recessed to form inner spacer recesses (not explicitly shown), while the exposed channel layers 208 are substantially unetched. In an embodiment where the channel layers 208 consist essentially of silicon (Si) and sacrificial layers 206 consist essentially of silicon germanium (SiGe), the selective and partial recess of the sacrificial layers 206 may include use of a selective isotropic etching process (e.g., a selective dry etching process or a selective wet etching process), and the extent at which the sacrificial layers 206 are recessed is controlled by duration of the etching process. The selective dry etching process may include use of one or more fluorine-based etchants, such as fluorine gas or hydrofluorocarbons. The selective wet etching process may include an APM etch (e.g., ammonia hydroxide-hydrogen peroxide-water mixture). After the formation of the inner spacer recesses, an inner spacer material layer is deposited over the workpiece 200, including in the inner spacer recesses. The inner spacer material layer may include silicon oxide, silicon nitride, silicon oxycarbide, silicon oxycarbonitride, silicon carbonitride, metal nitride, or a suitable dielectric material. The deposited inner spacer material layer is then etched back to remove excess inner spacer material layer over sidewalls of the channel layers 208, thereby forming the inner spacer features 218 as shown in FIG. 3. In some embodiments, the etch back process at block 106 may be a dry etch process that includes use of an oxygen-containing gas, hydrogen, nitrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBr_3$), an iodine-containing gas (e.g., $CF_3I$), other suitable gases and/or plasmas, and/or combinations thereof.

Figure 4:
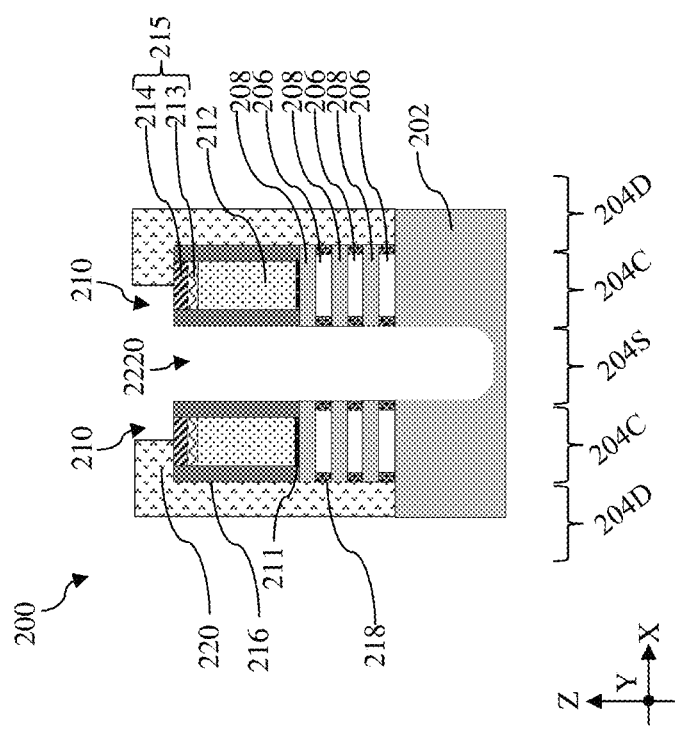

Referring to FIGS. 1 and 4, method 100 includes a block 108 where the source opening 222S is selectively extended into the substrate 202 to form an extended source opening 2220. At block 108, a first mask film 220 is formed over the workpiece 200, as shown in FIG. 4. The first mask film 220 may be a hard mask layer. The first mask film 220 may include silicon oxide, silicon nitride, silicon oxynitride, silicon oxycarbonitride, silicon carbide, or silicon oxycarbide. In an example process, a dielectric material is deposited over the workpiece using CVD or ALD to form the first mask film 220 and then a photoresist layer is deposited over the first mask film 220 using spin-on coating or a suitable process. The photoresist layer is patterned using photolithography processes to form a patterned photoresist layer. The patterned photoresist layer is then applied as an etch mask in an etch process to pattern the first mask film 220. As shown in FIG. 4, the patterned first mask film 220 cover/protect the drain openings 222D while the source opening 222S is exposed. An anisotropic etch process is then performed to extend the source opening 222S further into the substrate 202 to form an extended source opening 2220. In some instances, the extended source opening 2220 may extend between about 15 nanometer (nm) and about 35 nm into the substrate 202. In some implementations, the anisotropic etch process at block 108 may be a dry etch process that uses an oxygen-containing gas, hydrogen, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof.

Figure 5:
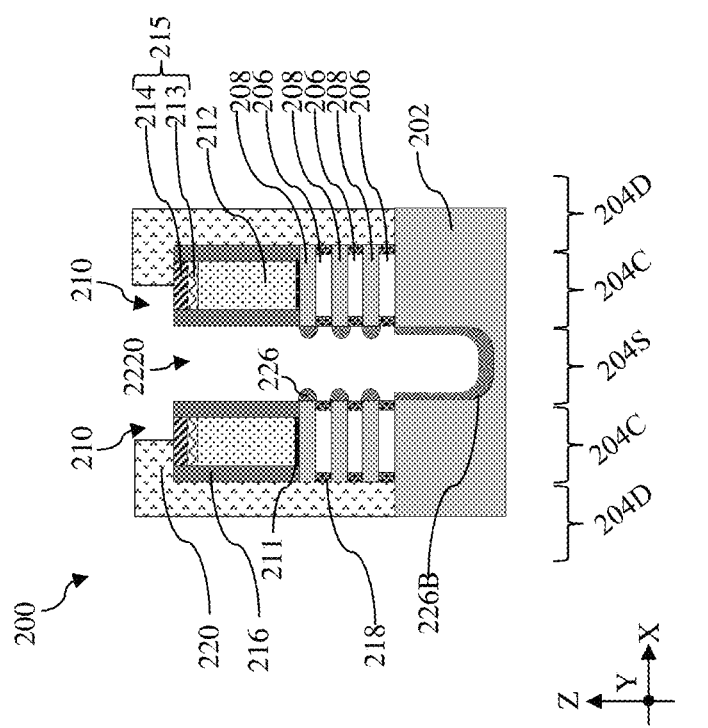

Referring to FIGS. 1 and 5, method 100 includes a block 110 where a plurality of epitaxial source features 226 are formed in the extended source opening 2220 to be in contact with sidewalls of the channel layers 208. In some embodiments, the epitaxial source features 226 may be deposited using an epitaxial deposition process, such as VPE, UHV- CVD, MBE, and/or other suitable processes. The epitaxial growth process may use gaseous and/or liquid precursors, which selectively interact with the semiconductor composition of the channel layers 208 and the substrate 202. That is, the plurality of epitaxial source features 226 are deposited on exposed surfaces of the channel layers 208 and the substrate 202 in the extended source opening 2220. Each of the plurality of epitaxial source features 226 is therefore coupled to one of the channel layers 208. According to the present disclosure, while the plurality of epitaxial source features 226 may moderately grow over a portion of the inner spacer features 218, they do not merge to form a continuous epitaxial layer. At block 110, a bottom epitaxial feature 226B may also be formed on the exposed surfaces of the substrate 202. In some embodiments, the bottom epitaxial feature 226B is spaced apart from the bottommost epitaxial source features 226. Depending on the conductivity type of the to-be-formed transistor, the epitaxial source features 226 may be n-type or p-type. Example n-type epitaxial source features may include silicon (Si), phosphorus-doped silicon (Si:P), arsenic-doped silicon (Si:As), antimony-doped silicon (Si:Sb), or other suitable material and may be in-situ doped during the epitaxial process by introducing an n-type dopant, such as phosphorus (P), arsenic (As), or antimony (Sb). Example p-type epitaxial source features 226 may include germanium (Ge), gallium-doped silicon germanium (SiGe:Ga), boron-doped silicon germanium (SiGe:B), or other suitable material and may be in-situ doped during the epitaxial process by introducing a p-type dopant, such as boron (B) or gallium (Ga). As shown in FIG. 5, when viewed along the Y direction, each of the epitaxial source features 226 may have an elongated island shape or a ridge that extends lengthwise along the Y direction. In some instances, when measured along the X direction, each of the epitaxial source features 226 may have a thickness between about 2.5 nm and about 4.5 nm.

Figure 6:
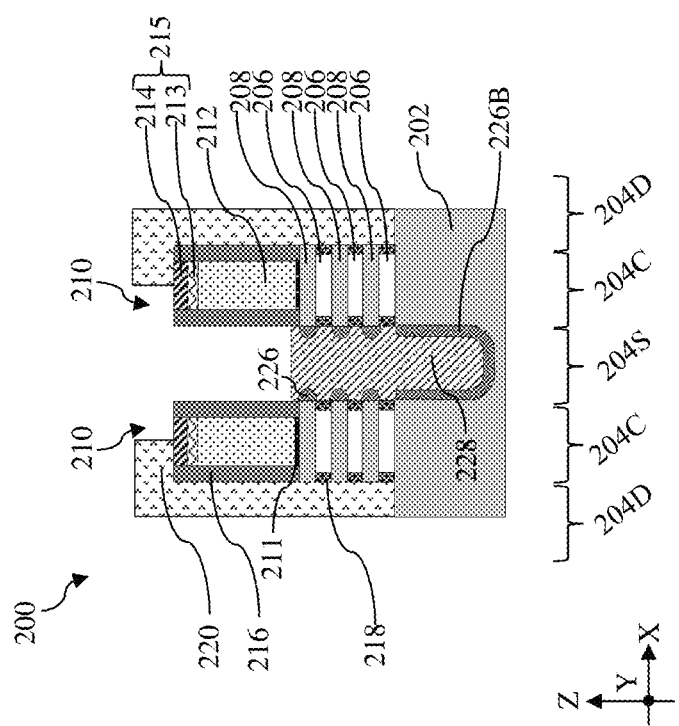

Referring to FIGS. 1 and 6, method 100 includes a block 112 where a sacrificial epitaxial layer 228 is deposited. In some embodiments, the sacrificial epitaxial layer 228 may include a semiconductor material different from the epitaxial source features 226 or the bottom epitaxial feature 226B. For example, when the epitaxial source features 226 or the bottom epitaxial feature 226B includes silicon (Si), the sacrificial epitaxial layer 228 may include silicon germanium (SiGe). When the epitaxial source features 226 or the bottom epitaxial feature 226B includes silicon germanium (SiGe), the sacrificial epitaxial layer 228 may include silicon (Si), germanium (Ge), or germanium-rich silicon germanium (SiGe). Difference in the semiconductor material allows the sacrificial epitaxial layer 228 to be removed without substantially damaging the epitaxial source features 226. The sacrificial epitaxial layer 228 may be doped or undoped. When the sacrificial epitaxial layer 228 is doped, it is doped with the same type of dopant in the epitaxial source features 226 and its doping concentration is smaller than that of the epitaxial source feature 226. As the sacrificial epitaxial layer 228 will be removed in a subsequent process, its composition or doping concentration is determined based the desired etching selectivity with respect to the epitaxial source features 226. The sacrificial epitaxial layer 228 may also be referred to as a dummy epitaxial layer. In some embodiments, the dummy epitaxial layer 228 may be formed using VPE, UHV-CVD, MBE, and/or other suitable processes. After the formation of the sacrificial epitaxial layer 228, the first mask film 220 may be removed from the workpiece 200.

Figure 7:
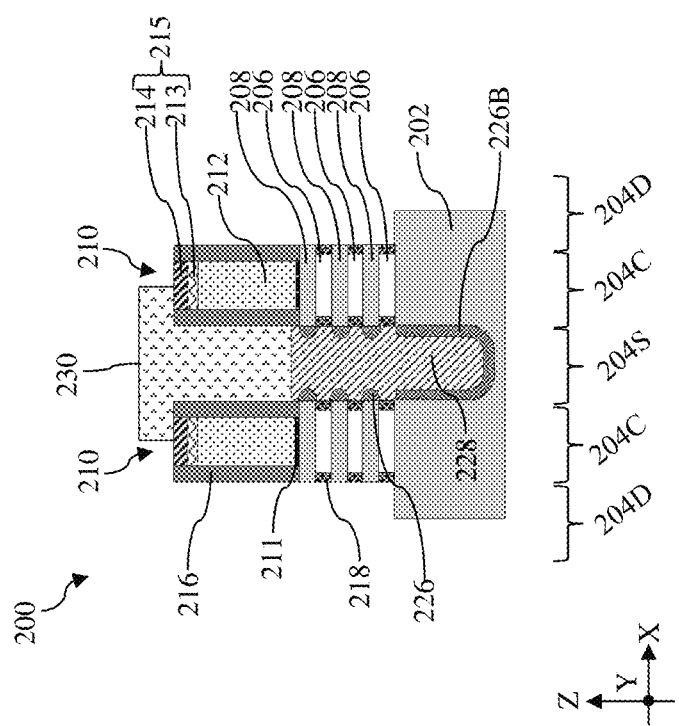
Figure 8:
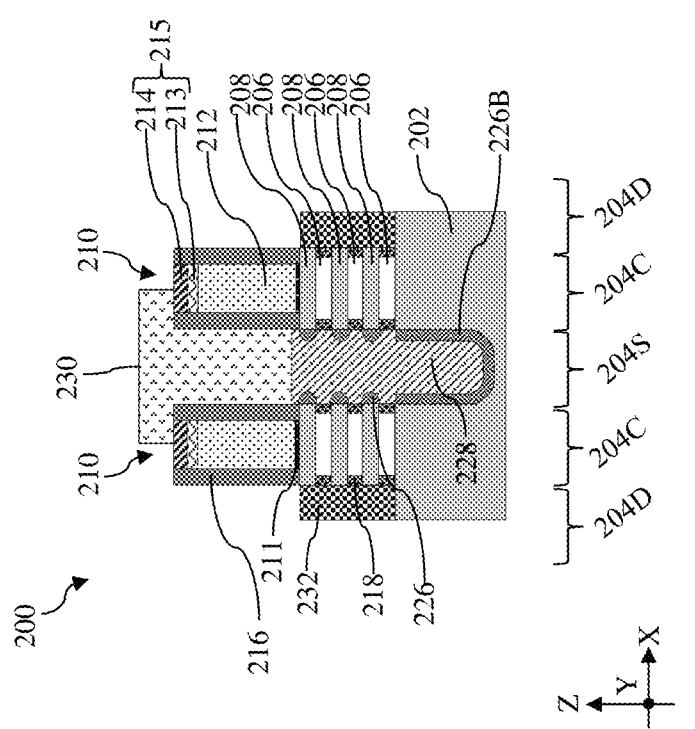

Referring to FIGS. 1, 7 and 8, method 100 includes a block 114 where a drain feature 232 is formed. At block 114, a second mask film 230 is formed over the workpiece 200, as shown in FIG. 7. The second mask film 230 may be a patterned hard mask layer. The second mask film 230 may include silicon oxide, silicon nitride, silicon oxynitride, silicon oxycarbonitride, silicon carbide, or silicon oxycarbide. In an example process, a dielectric material is deposited over the workpiece using CVD or ALD to form the second mask film 230 and then a photoresist layer is deposited over the second mask film 230 using spin-on coating or a suitable process. The photoresist layer is patterned using photolithography processes to form a patterned photoresist layer. The patterned photoresist layer is then applied as an etch mask in an etch process to pattern the second mask film 230. As shown in FIG. 7, the patterned second mask film 230 cover/protect the source openings 222S while the drain opening 222D is exposed.

Reference is now made to FIG. 8. In some embodiments, the drain feature 232 may be deposited using an epitaxial process, such as VPE, UHV-CVD, MBE, and/or other suitable processes. The epitaxial growth process may use gaseous and/or liquid precursors, which interact with the composition of the channel layers 208 and the substrate 202. The drain feature 232 is therefore coupled to the channel layers 208. Depending on the conductivity type of the to-be-formed transistor, the drain feature 232 may be an n-type drain feature or a p-type drain features. Example n-type source/drain features may include silicon (Si), phosphorus-doped silicon (Si:P), arsenic-doped silicon (Si:As), antimony-doped silicon (Si:Sb), or other suitable material and may be in-situ doped during the epitaxial process by introducing an n-type dopant, such as phosphorus (P), arsenic (As), or antimony (Sb). Example p-type source/drain features may include germanium (Ge), gallium-doped silicon germanium (SiGe:Ga), boron-doped silicon germanium (SiGe:B), or other suitable material and may be in-situ doped during the epitaxial process by introducing a p-type dopant, such as boron (B) or gallium (Ga). Although the deposition of the drain feature 232 may be substantially selective to semiconductor surfaces, overgrowth of the drain feature 232 may merge over the inner spacer features 218. That is, the drain feature 232 may come in direct contact with both the inner spacer features 218 and the channel layers 208.

Figure 9:
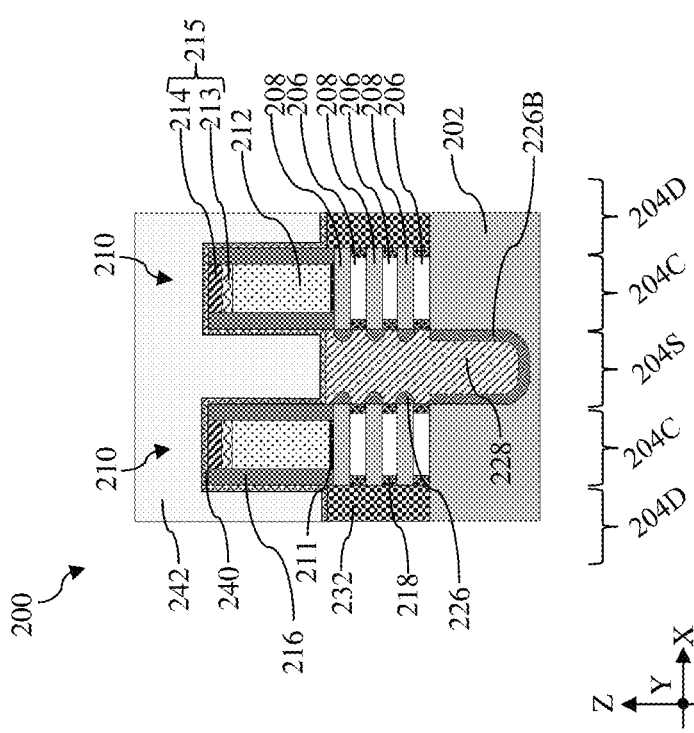

Referring to FIGS. 1 and 9, method 100 includes a block 116 where a contact etch stop layer (CESL) 240 and a first interlayer dielectric layer 242 are deposited. The CESL 240 may include silicon nitride, silicon oxynitride, and/or other materials known in the art and may be formed by ALD, plasma-enhanced chemical vapor deposition (PECVD) process and/or other suitable deposition or oxidation processes. As shown in FIG. 9, the CESL 240 may be deposited on top surfaces of the sacrificial epitaxial layer 228, the drain features 232, and sidewalls of the gate spacer layer 216. The first ILD layer 242 is then deposited by a PECVD process or other suitable deposition technique over the workpiece 200 after the deposition of the CESL 240. The first ILD layer 242 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. In some embodiments, after formation of the first ILD layer 242, the workpiece 200 may be annealed to improve integrity of the first ILD layer 242.

Figure 10:
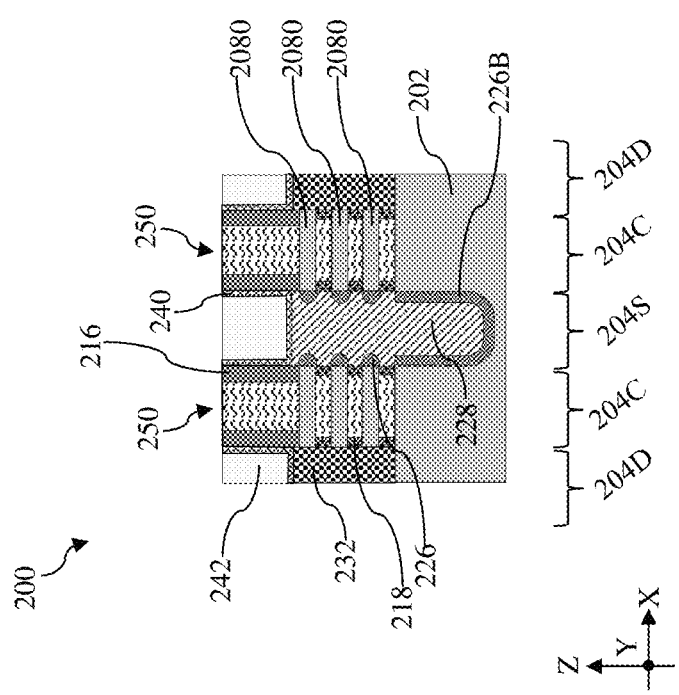

Referring to FIGS. 1 and 10, method 100 includes a block 118 where the dummy gate stacks 210 are replaced with gate structures 250. To remove excess materials and to expose top surfaces of the dummy gate stacks 210, a planarization process, such a chemical mechanical polishing (CMP) process may be performed to the workpiece 200. With the exposure of the dummy gate stacks 210, block 118 proceeds to removal of the dummy gate stacks 210. The removal of the dummy gate stacks 210 may include one or more etching processes that are selective to the material in the dummy gate stacks 210. For example, the removal of the dummy gate stacks 210 may be performed using as a selective wet etch, a selective dry etch, or a combination thereof. After the removal of the dummy gate stacks 210, sidewalls and top surfaces of the channel layers 208 and the sacrificial layers 206 are exposed. After the removal of the dummy gate stacks 210, the sacrificial layers 206 in the channel regions 204C are selectively removed to release the channel layers 208 as channel members 2080. In some example processes, the sacrificial layers 206 may be removed using selective dry etch process or selective wet etch process. The selective dry etch process may include use of one or more fluorine-based etchants, such as fluorine gas or hydrofluorocarbons. The selective wet etching process may include an APM etch (e.g., ammonia hydroxide-hydrogen peroxide-water mixture).

Block 118 also includes operations to deposit gate structures 250 in the channel regions 204C. As shown in FIG. 10, each of the gate structures 250 is deposited to wrap around each of the channel members 2080. Each of the gate structures 250 may include an interfacial layer, a gate dielectric layer over the interfacial layer and a gate electrode layer over the gate dielectric layer. In some embodiments, the interfacial layer includes silicon oxide and may be formed in a pre-clean process. An example pre-clean process may include use of RCA SC-1 (a mixture of ammonium hydroxide, hydrogen peroxide and water) and/or RCA SC-2 (a mixture of hydrochloric acid, hydrogen peroxide and water). The gate dielectric layer may also be referred to a high-k dielectric layer, as it is formed of a dielectric material having a dielectric constant greater than that of silicon dioxide, which is about 3.9. The gate dielectric layer may be deposited over the interfacial layer using ALD, CVD, and/or other suitable methods. The gate dielectric layer may include hafnium oxide. Alternatively, the gate dielectric layer may include other high-K dielectrics, such as titanium oxide ($TiO_2$), hafnium zirconium oxide (HfZrO), tantalum oxide ($Ta_2O_5$), hafnium silicon oxide ($HfSiO_4$), zirconium oxide ($ZrO_2$), zirconium silicon oxide ($ZrSiO_2$), lanthanum oxide ($La_2O_3$), aluminum oxide ($Al_2O_3$), zirconium oxide (ZrO), yttrium oxide ($Y_2O_3$), $SrTiO_3$ (STO), $BaTiO_3$ (BTO), BaZrO, hafnium lanthanum oxide (HfLaO), lanthanum silicon oxide (LaSiO), aluminum silicon oxide (AlSiO), hafnium tantalum oxide (HfTaO), hafnium titanium oxide (HfTiO), $(Ba,Sr)TiO_3$ (BST), silicon nitride (SiN), silicon oxynitride (SiON), combinations thereof, or other suitable material.

The gate electrode layer is then deposited over the gate dielectric layer using ALD, PVD, CVD, e-beam evaporation, or other suitable methods. The gate electrode layer may include a single layer or alternatively a multi-layer structure, such as various combinations of a metal layer with a selected work function to enhance the device performance (work function metal layer), a liner layer, a wetting layer, an first adhesion layer, a metal alloy or a metal silicide. By way of example, the gate electrode layer may include titanium nitride (TiN), titanium aluminum (TiAl), titanium aluminum nitride (TiAlN), tantalum nitride (TaN), tantalum aluminum (TaAl), tantalum aluminum nitride (TaAlN), tantalum aluminum carbide (TaAlC), tantalum carbonitride (TaCN), aluminum (Al), tungsten (W), nickel (Ni), titanium (Ti), ruthenium (Ru), cobalt (Co), platinum (Pt), tantalum carbide (TaC), tantalum silicon nitride (TaSiN), copper (Cu), other refractory metals, or other suitable metal materials or a combination thereof. Further, where the semiconductor device 200 includes n-type transistors and p-type transistors, different gate electrode layers may be formed separately for n-type transistors and p-type transistors, which may include different work function metal layers (e.g., for providing different n-type and p-type work function metal layers). In some instances, the workpiece 200 may be subject to a CMP process to provide a planar top surface.

Figure 11:
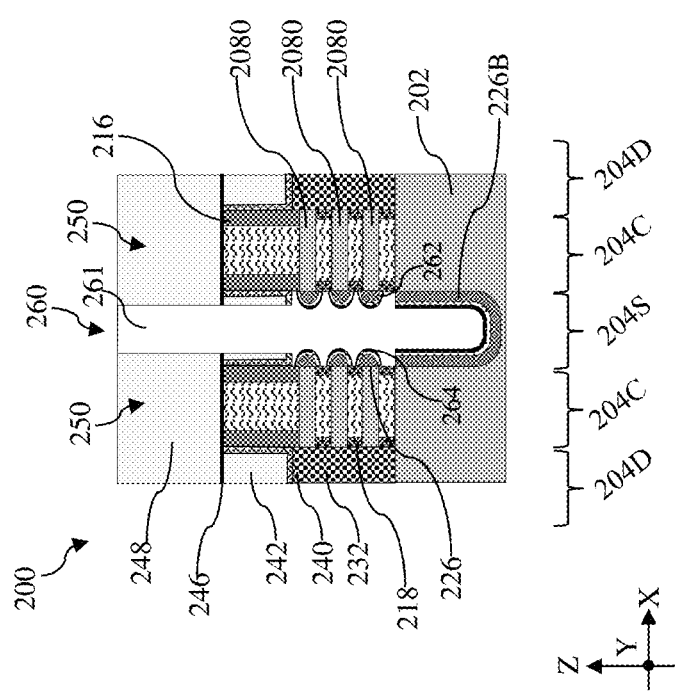
Figure 12:
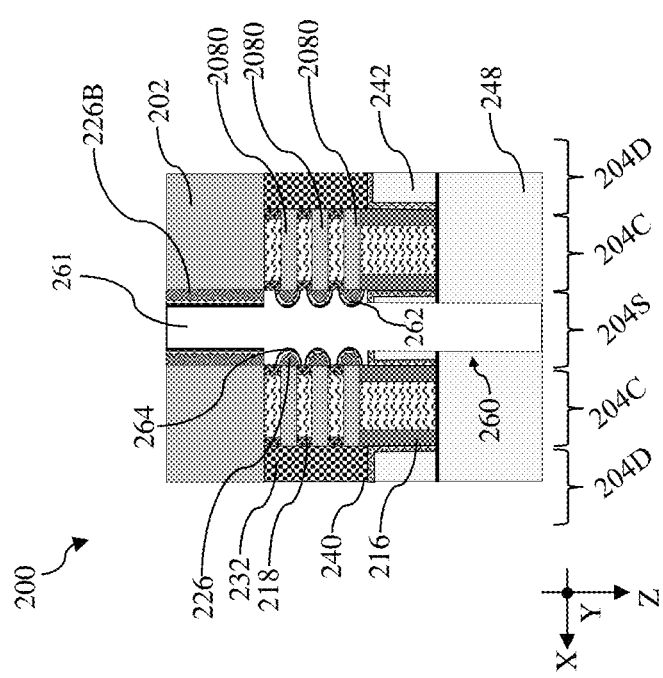

Referring to FIGS. 1 and 11, method 100 includes a block 120 where a second ILD layer 248 is deposited over the workpiece 200. After the gate structures 250 are formed and the workpiece 200 is planarized, a second ILD layer 248 may be deposited over the workpiece 200. As the composition and the formation of the second ILD layer 248 may be similar to the first ILD layer 242, detailed description of the second ILD layer 248 are omitted for brevity. In some embodiments represented in FIG. 11, before the deposition of the second ILD layer 248, a capping layer 246 may be deposited over the workpiece 200 to protect the gate structures 250. In some instances, the capping layer 246 may include silicon nitride or silicon carbonitride. The capping layer 246 may be deposited using CVD, ALD, or a suitable deposition process.

Referring to FIGS. 1 and 11, method 100 includes a block 122 where a through-substrate source contact 260 is formed. Operations at block 122 may include formation of a through-substrate source contact opening, formation of a first silicide layer 262, formation of a first adhesion layer 264, and deposition of a metal fill material in the through-substrate source contact opening to form the through-substrate source contact 260. Formation of the through-substrate source contact opening may include photolithography processes and etch processes. In an example, a patterned hard mask may be formed over the workpiece 200. The patterned hard mask is then applied as an etch mask to etch through the second ILD layer 248, the capping layer 246, the first ILD layer 242, the CESL 240, and the sacrificial epitaxial layer 228. In some embodiments, the etch process may include more than one stage. For example, the etch process may include a first stage and second stage. The first stage may include anisotropic dry etch directed to etching of the second ILD layer 248, the capping layer 246, the first ILD layer 242, the CESL 240. The second stage may include selective etching of the sacrificial epitaxial layer 228 without substantially damaging the epitaxial source features 226. For example, the second stage may implement a selective wet etch process or a selective dry etch process. In the depicted implementations, the etch process at block 122 substantially removes the sacrificial epitaxial layer 228 to expose the epitaxial source features 226 and the bottom epitaxial feature 226B. In some instances, the etch process at block 122 may be anisotropic and may reduce a thickness of the bottom epitaxial feature 226B.

In order to reduce contact resistance between the epitaxial source features 226 and the through-substrate source contact 260, the first silicide layer 262 may be formed on the exposed surface of the epitaxial source features 226 in the through-substrate source contact opening. To form the first silicide layer 262, a metal layer is deposited over the exposed surfaces of the epitaxial source features 226 and an anneal process is performed to bring about silicidation reaction between the metal layer and the epitaxial source features 226. Suitable metal layer may include titanium (Ti), tantalum (Ta), nickel (Ni), cobalt (Co), or tungsten (W). The first silicide layer 262 may include titanium silicide (TiSi), titanium silicon nitride (TiSiN), tantalum silicide (TaSi), tungsten silicide (WSi), cobalt silicide (CoSi), or nickel silicide (NiSi). The first silicide layer 262 generally tracks the shape of the epitaxial source features 226. Although not explicitly shown, the excess metal layer that does not form the first silicide layer 262 may be removed. In some embodiments, the metal layer may also be deposited on the bottom epitaxial feature 226B and the annealing may also form the first silicide layer 262 on the bottom epitaxial feature 226B. After the formation of the first silicide layer 262, the first adhesion layer 264 may be formed by depositing a metal layer using CVD, follow by nitridation of the metal layer. In some implementations, the deposition of the metal layer is configured such that the metal layer is selectively deposited on the first silicide layer 262 but not on the dielectric surfaces, such as the surfaces of the inner spacer features 218, the first ILD layer 242, or the second ILD layer 248. The nitridation process may include use of a nitrogen-containing gas such as nitrogen or ammonia and may be aided by plasma. The nitridation process converts the metal layer into a metal nitride layer. In some instances, the metal layer may include titanium (Ti), tantalum (Ta), nickel (Ni), cobalt (Co), or tungsten (W) and the first adhesion layer 264 may include titanium nitride (TiN), cobalt nitride (CoN), nickel nitride (NiN), tungsten nitride (WN), or tantalum nitride (TaN). In one embodiment, the metal layer includes titanium (Ti) and the first adhesion layer 264 includes titanium nitride (TiN). In some instances, both the first silicide layer 262 and the first adhesion layer 264 may have a thickness between about 1 nm and about 3 nm.

After the formation of the first silicide layer 262 and the first adhesion layer 264, a metal fill layer 261 may be deposited into the through-substrate source contact opening to form the through-substrate source contact 260. The metal fill layer 261 may include aluminum (Al), rhodium (Rh), molybdenum (Mo), cobalt (Co), ruthenium (Ru), copper (Cu), iridium (Ir), or tungsten (W). A planarization process, such as a CMP process, may follow to remove excess materials over the second ILD layer 248 and provide a planar top surface. The through-substrate source contact 260 is electrically coupled to the epitaxial source features 226 by way of the first silicide layer 262 and the first adhesion layer 264. In other words, the first silicide layer 262 and the first adhesion layer 264 are sandwiched between the epitaxial source features 226 and the through-substrate source contact 260. As shown in FIG. 11, a portion of the through-substrate source contact 260 may extend into two adjacent ones of the epitaxial source features 226. Additionally, if the first adhesion layer 264 may be viewed as a part of or an extension of the through-substrate source contact 260, the through-substrate source contact 260 is in direct contact with the inner spacer features 218.

Although not explicitly shown, before the workpiece 200 is flipped over for operations from the back side of the workpiece 200, an interconnect structure may be formed over the workpiece 200. In some embodiments, the interconnect structure may include multiple intermetal dielectric (IMD) layers and multiple metal lines or contact vias in each of the IMD layers. In some instances, the IMD layers and the first ILD layer 242 may share similar composition. The metal lines and contact vias in each IMD layer may be formed of metal, such as aluminum (Al), tungsten (W), ruthenium (Ru), or copper (Cu). In some embodiments, the metal lines and contact vias may be lined by a barrier layer to insulate the metal lines and contact vias from the IMD layers and to prevent electro-migration.

Referring to FIGS. 1, 12, 13, and 14, method 100 includes a block 124 where a backside dielectric layer 270 is formed. In some embodiments, operations at block 124 may be performed with a back side of the workpiece 200 facing up. In an example process to flip the workpiece 200 over, a carrier substrate is bonded to the front side of the workpiece 200 or the interconnect structure. The workpiece 200 is then flipped over along with the carrier substrate. In some instances, the carrier substrate may be bonded to the workpiece 200 by fusion bonding, by use of an adhesion layer, or a combination thereof. In some instances, the carrier substrate may be formed of semiconductor materials (such as silicon), sapphire, glass, polymeric materials, or other suitable materials. In embodiments where fusion bonding is used, the carrier substrate includes a bottom oxide layer and the workpiece 200 (or the interconnect structure, if formed)) includes a top oxide layer. After both the bottom oxide layer and top oxide layer are treated, they are placed in plush contact with one another for direct bonding at room temperature or at an elevated temperature. After the carrier substrate is bonded to the workpiece 200 (or the interconnect structure, if formed), the workpiece 200 is flipped up-side-down, as representatively shown in FIG. 12.

Figure 13:
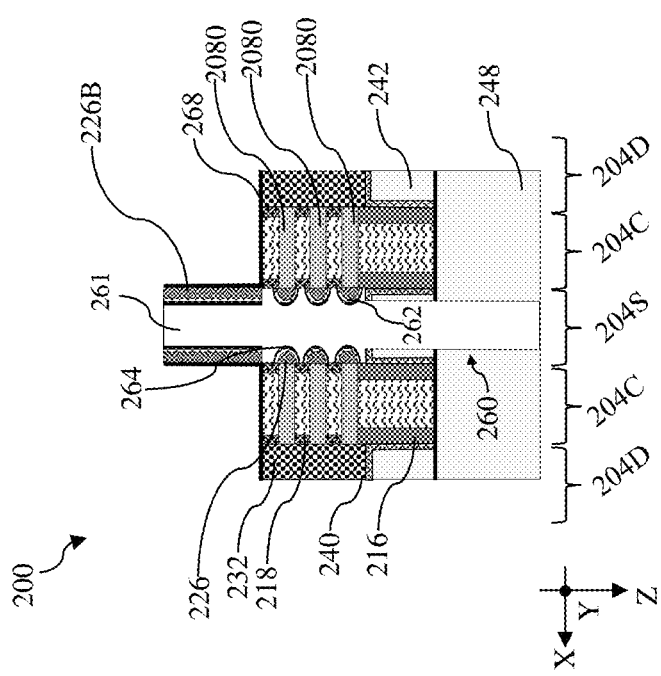
Figure 14:
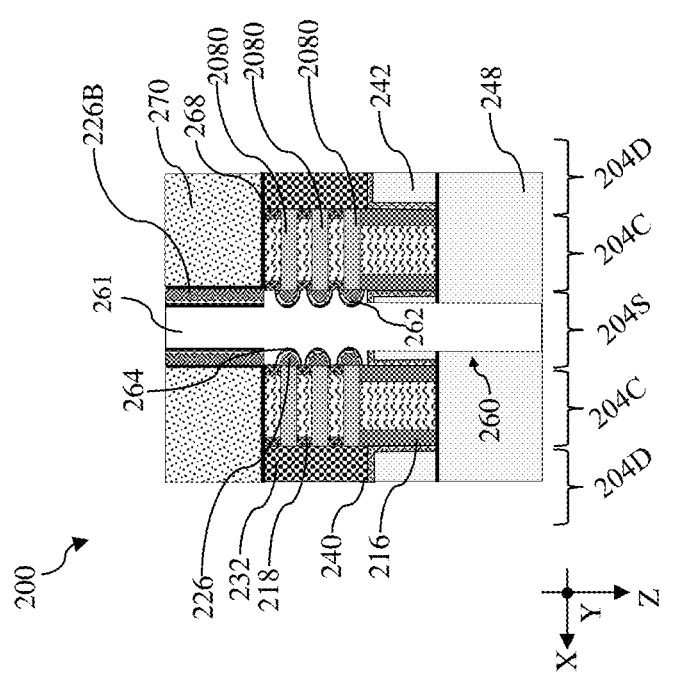

After the workpiece 200 is flipped over, a back side of the workpiece 200 is planarized until the isolation feature and the through-substrate source contact 260 are exposed. The planarization may remove a portion of the substrate 202 and a portion of the bottom epitaxial feature 226B. Referring to FIG. 13 and FIG. 14, the remaining substrate 202 is then replaced with a backside dielectric layer 270. The replacement process includes a selective removal of the substrate 202 without substantially damaging the bottom epitaxial feature 226B and the through-substrate source contact 260, as shown in FIG. 13. This selective removal is made possible by the fact that the substrate 202 have different compositions from surrounding structures, such the isolation feature (i.e., STI), the first silicide layer 262, the first adhesion layer 264, the bottom epitaxial feature 226B, and the metal fill layer 261. After the substrate 202 is selectively removed, the backside dielectric layer 270 may be deposited over a back side of the workpiece 200 by FCVD, CVD, PECVD, spin-on coating, or a suitable process. After the formation of the backside dielectric layer 270, the back side of the workpiece 200 is planarized by a CMP process to expose a surface of the through-substrate source contact 260, as shown in FIG. 14. In some embodiments, before the deposition of the backside dielectric layer 270, a protective layer 268 may be deposited over the backside of the workpiece 200. In some embodiments, the backside dielectric layer 270 may include silicon oxide or a composition similar to that of the first ILD layer 242. The protective layer 268 may include silicon nitride or silicon carbonitride and may be deposited using CVD, ALD, or a suitable deposition technique.

Figure 15:
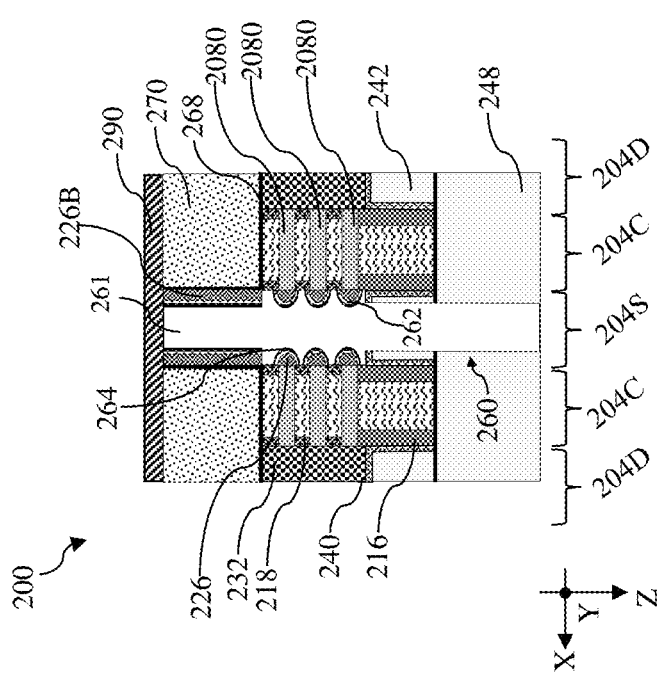

Referring to FIGS. 1 and 15, method 100 includes a block 126 where a backside power rail 290 is formed. While not explicitly shown in FIG. 15, the backside power rail 290 may be embedded in an insulation layer. In an example process, an insulation layer having a composition similar to the first ILD layer 242 may be deposited over the backside of the workpiece 200, including over the backside dielectric layer 270, the isolation feature, and the backside surface of the through-substrate source contact 260. Then, a power rail trench may be patterned in the insulation layer. A barrier layer and a metal fill material are then deposited into the power rail trench to form the backside power rail 290. In some embodiments, the barrier layer in the backside power rail 290 may include titanium nitride, tantalum nitride, cobalt nitride, nickel nitride, or tungsten nitride and the metal fill material in the backside power rail 290 may include titanium (Ti), ruthenium (Ru), copper (Cu), nickel (Ni), cobalt (Co), tungsten (W), tantalum (Ta), or molybdenum (Mo). The barrier layer and the metal fill layer may be deposited using PVD, CVD, ALD, or electroless plating. A planarization process, such as a CMP process, may be performed to remove excess materials over the insulation layer. The backside power rail 290 is electrically coupled to the through-substrate source contact 260.

Figure 16:
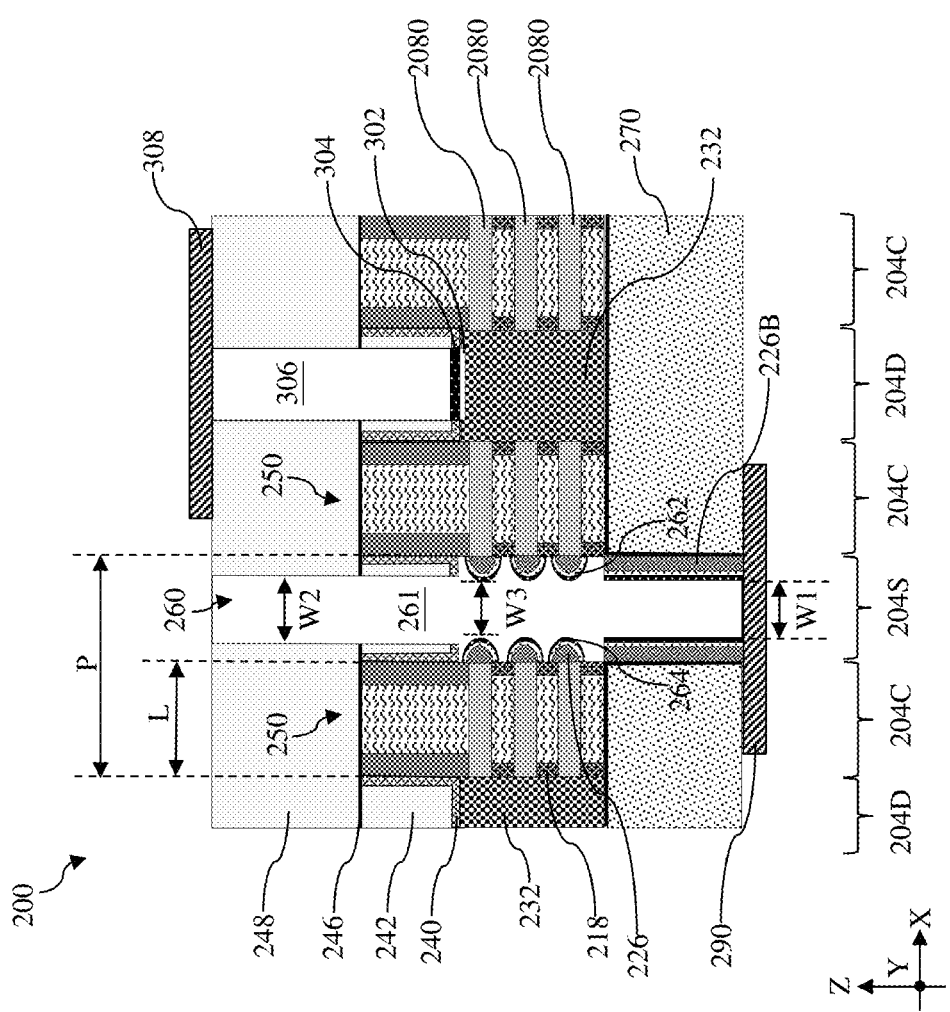

FIG. 16 illustrates an additional example where a frontside drain contact 306 is formed. The frontside drain contact opening may be formed simultaneously with the through-substrate source contact opening in some embodiments. As shown in FIG. 16, the frontside drain contact opening is formed through the second ILD layer 248, the capping layer 246, the first ILD layer 242, and the CESL 240 to expose the drain feature 232. To lower contact resistance, a second silicide layer 302 is formed on the drain feature 232. To improve adhesion, a second adhesion layer 304 may be formed over the second silicide layer 302. The composition and formation of the second silicide layer 302 may be similar to the first silicide layer 262. The composition and formation of the second adhesion layer 304 may be similar to those of the first adhesion layer 264. As both the first silicide layer 262 and the first adhesion layer 264 are described above, detailed description of the second silicide layer 302 and the second adhesion layer 304 are omitted. In the example illustrated in FIG. 16, a metal line 308 may be formed over the frontside drain contact 306. The composition and formation of the metal line 308 may be similar to those of the backside power rail 290. The metal line 308 may be part of the interconnect structure described above. Because the metal line 308 is the first metal line over the gate structures 250, the metal line 308 may also be referred to as $M_0$ line in an $M_0$ layer of the interconnect structure.

In some embodiments represented in FIG. 16, the through-substrate source contact 260 may include a backside portion disposed in the backside dielectric layer 270, a source portion disposed between epitaxial source features 226, and a frontside portion disposed in the second ILD layer 248. The backside portion includes a first width W1 along the X direction, the source portion includes a second width W2 along the X direction, and the frontside portion includes a third width W3 along the X direction. In some embodiments, the first width W1 is greater than the third width W3 and the third width W3 is greater than the second width W2. In some instances, the first width W1 may be between about 15 nm and about 22 nm, the second width W2 may be between about 12 nm and about 16 nm, and the third width W3 may be between about 12 nm and about 18 nm. Each of the gate structures 250 may have a gate length L between 13 nm and about 19 nm and the gate structures 250 may include a gate pitch P between about 40 nm and about 50 nm.

Embodiments of the present disclosure provide advantages. For example, a semiconductor device of the present disclosure includes a through-substrate source contact that extends from a front side of the semiconductor device to a back side of the semiconductor device. As a result, separate backside source contact openings are not needed and the risks of damages to source features are avoided. In addition, the through-substrate source contact engages the plurality of epitaxial source features that resemble elongated islands or ridges. Such an engagement increases the interfacial areas between the through-substrate source contact and the epitaxial source features, thereby reducing contact resistance.

In one exemplary aspect, the present disclosure is directed to a semiconductor device. The semiconductor device includes a first plurality of channel members over a backside dielectric layer, a second plurality of channel members over the backside dielectric layer, a first gate structure over and wrapping around each of the first plurality of channel members, a second gate structure over and wrapping around each of the second plurality of channel members, and a through-substrate contact that extends between the first plurality of channel members and the second plurality of channel members, between the first gate structure and the second gate structure, and through the backside dielectric layer.

In some embodiments, the semiconductor device may further include a first plurality of epitaxial features in contact with the first plurality of channel members, and a second plurality of epitaxial features in contact with the second plurality of channel members. Each of the first plurality of channel members is spaced apart from the through-substrate contact by one of the first plurality of epitaxial features and each of the second plurality of channel members is spaced apart from the through-substrate contact by one of the second plurality of epitaxial features. In some implementations, the semiconductor device may further include a silicide layer disposed between the first plurality of epitaxial features and the through-substrate contact. In some instances, a portion of the through-substrate contact extends between two adjacent epitaxial features of the first plurality of epitaxial features. In some embodiments, the first plurality of channel members are interleaved by a plurality of inner spacer features and the through-substrate contact is in direct contact with each of the plurality of inner spacer features. In some embodiments, the first plurality of channel members and the second plurality of channel members extend lengthwise along a direction. Each of the first plurality of epitaxial feature includes a thickness along the direction B and the thickness is between about 2.5 nm and about 3.5 nm. In some embodiments, the semiconductor device may further include a backside metal line disposed along a bottom surface of the backside dielectric layer. The through-substrate contact is in direct contact with the backside metal line. In some instances, the through-substrate contact includes aluminum (Al), titanium (Ti), ruthenium (Ru), copper (Cu), nickel (Ni), cobalt (Co), tungsten (W), or molybdenum (Mo).

In another exemplary aspect, the present disclosure is directed to a semiconductor structure. The semiconductor structure includes a backside dielectric layer, first channel members over the backside dielectric layer, second channel members over the backside dielectric layer, a first gate structure wrapping around each of the first channel members, a second gate structure wrapping around each of the second channel members, a dielectric layer disposed over the first gate structure and the second gate structure, and a through-substrate contact that extends continuously through the dielectric layer and the backside dielectric layer.

In some embodiments, the through-substrate contact includes a first portion disposed in the dielectric layer and a second portion disposed in the backside dielectric layer and a width of the second portion is greater than a width of the first portion. In some implementations, the semiconductor device may further include first epitaxial features in contact with end surfaces of the first channel members, and second epitaxial features in contact with end surfaces of the second channel members. Each of the first channel members is spaced apart from the through-substrate contact by one of the first epitaxial features. Each of the second channel members is spaced apart from the through-substrate contact by one of the second epitaxial features. In some implementations, the semiconductor structure may further include a silicide layer disposed between the first epitaxial features and the through-substrate contact. In some instances, a portion of the through-substrate contact extends between two adjacent ones of the first of epitaxial features. In some embodiments, the first channel members are interleaved by a plurality of inner spacer features and the through-substrate contact is in direct contact with each of the plurality of inner spacer features. In some instances, the semiconductor structure may further include a backside metal line disposed along a bottom surface of the backside dielectric layer. The through-substrate contact is in direct contact with the backside metal line.

In yet another exemplary aspect, the present disclosure is directed to a method. The method includes receiving a workpiece that includes a fin-shaped structure over a substrate, the fin-shaped structure including a plurality of channel layers, and a first dummy gate stack and a second dummy gate stack over the fin-shaped structure, forming a source opening in the fin-shaped structure between the first dummy gate stack and the second dummy gate stack to expose sidewalls of the fin-shaped structure, extending the source opening into the substrate to form an extended source opening, forming a plurality of epitaxial features over the exposed sidewalls of the plurality of channel layers, after the forming of the plurality of epitaxial features, depositing a dummy epitaxial layer into the extended source opening, replacing the first dummy gate stack and the second dummy gate stack with a first gate structure and a second gate structure, respectively, depositing a dielectric layer over the first gate structure and the second gate structure, forming a through-substrate opening through the dielectric layer, the dummy epitaxial layer, and into the substrate, wherein the plurality of epitaxial features are exposed in the through-substrate opening, and forming a through-substrate contact in the through-substrate opening.

In some embodiments, the dummy epitaxial layer includes silicon germanium (SiGe). In some embodiments, the plurality of channel layers are interleaved by a plurality of sacrificial layers and a plurality of inner spacer features. In some implementations, the method may further include before the forming of the through-substrate contact, depositing a metal layer in the through-substrate opening and over the plurality of epitaxial features, and after the depositing of the metal layer, annealing the workpiece to form a silicide layer over the plurality of epitaxial features. In some instances, the method may further include replacing the substrate with a backside dielectric layer.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   receiving a workpiece comprising:
      a fin-shaped structure over a front side of a substrate, the fin-shaped structure comprising a plurality of channel layers interleaved by a plurality of sacrificial layers, the fin-shaped structure comprising a source region, a drain region and a channel region sandwiched between the source region and the drain region,
      a dummy gate stack disposed over the channel region, and
      a gate spacer layer disposed over the dummy gate stack and the fin-shaped structure;
   forming a source opening through the source region of the fin-shaped structure and a drain opening through the drain region of the fin-shaped structure;
   selectively extending the source opening into the substrate to form an extended source opening while the drain region is covered by a first mask film;
   forming a source epitaxial layer in the extended source opening;
   forming a sacrificial epitaxial layer over the source epitaxial layer;
   removing the first mask film to expose the source opening;
   forming a drain epitaxial layer in the source opening;
   removing the dummy gate stack;
   after the removing of the dummy gate stack, selectively removing the plurality of sacrificial layers in the channel region to release the plurality of channel layers as a plurality of channel members;
   forming a gate structure to wrap around each of the plurality of channel members;
   after the forming of the gate structure, etching the source region to remove the sacrificial epitaxial layer and expose the source epitaxial layer;
   forming a source contact extending into the extended source opening to electrically couple to the source epitaxial layer; and
   planarizing a back side of the substrate to expose the source contact.

2. The method of claim 1, further comprising:
   after the forming of the source opening and the drain opening, selectively and partially etching end surfaces of the plurality of sacrificial layers to form inner spacer recesses; and
   forming inner spacer features in the inner spacer recesses.

3. The method of claim 2, wherein the source epitaxial layer does not merge over the inner spacer features.

4. The method of claim 1, wherein the sacrificial epitaxial layer comprises silicon germanium (SiGe).

5. The method of claim 1,
   wherein the extended source opening exposes surfaces of the substrate,
   wherein the forming of the source epitaxial layer forms the source epitaxial layer along surfaces of the substrate.

6. The method of claim 1, wherein the forming of the source contact comprises:
   forming a silicide layer on surfaces of the source epitaxial layer;
   depositing an adhesion layer over the silicide layer; and
   depositing a metal fill layer over the adhesion layer.

7. The method of claim 6, wherein the adhesion layer comprises titanium nitride (TiN), cobalt nitride (CoN), nickel nitride (NiN), tungsten nitride (WN), or tantalum nitride (TaN).

8. The method of claim 6, wherein the depositing of the adhesion layer comprises:
   depositing a metal layer over the silicide layer; and
   performing a nitridation process to the metal layer to form the adhesion layer.

9. The method of claim 1, wherein the first mask film comprises silicon oxide, silicon nitride, silicon oxynitride, silicon oxycarbonitride, silicon carbide, or silicon oxycarbide.

10. The method of claim 1, wherein the forming of the drain epitaxial layer comprises depositing a second mask film over the sacrificial epitaxial layer over the source region.

11. The method of claim 1, further comprising:
    before the removing of the dummy gate stack, depositing a contact etch stop layer (CESL) over the workpiece; and
    depositing an interlayer dielectric (ILD) layer over the CESL.

12. A method, comprising:
    receiving a workpiece comprising:
       a substrate comprising a first channel region, a second channel region, and a source region sandwiched between the first channel region and the second channel region,
       a first semiconductor stack over the first channel region on a front side of the substrate, and
       a second semiconductor stack over the second channel region on the front side of the substrate;
    etching the source region to form an extended source opening into the substrate;
    forming a source epitaxial layer over the extended source opening;
    forming a sacrificial epitaxial layer over the source epitaxial layer;
    removing the sacrificial epitaxial layer to expose the source epitaxial layer;
    forming a source contact in the extended source opening to be electrically coupled to the source epitaxial layer; and
    planarizing a back side of the substrate to expose the source contact.

13. The method of claim 12,
    wherein the workpiece further comprises:
       a first dummy gate stack over the first semiconductor stack, and
       a second dummy gate stack over the second semiconductor stack,
    wherein the first semiconductor stack comprises a first plurality of channel layers interleaved by a first plurality of sacrificial layers,
    wherein the second semiconductor stack comprises a second plurality of channel layers interleaved by a second plurality of sacrificial layers.

14. The method of claim 13, further comprising:
    before the removing of the sacrificial epitaxial layer, removing the first dummy gate stack and the second dummy gate stack; and
    after the removing of the first dummy gate stack and the second dummy gate stack, selectively removing the first plurality of sacrificial layers and the second plurality of sacrificial layers to release the first plurality of channel layers as a first plurality of channel members and to release the second plurality of channel layers as a second plurality of channel members.

15. The method of claim 12, further comprising:
    after the planarizing, replacing a remaining portion of the substrate with a backside dielectric layer.

16. The method of claim 12, wherein the forming of the source contact comprises:
    forming a silicide layer on surfaces of the source epitaxial layer;
    depositing an adhesion layer over the silicide layer; and
    depositing a metal fill layer over the adhesion layer.

17. A semiconductor device, comprising:
    a first active region and a second active region over a backside dielectric layer;
    a first gate structure over the first active region;
    a second gate structure over the second active region;
    an interlayer dielectric (ILD) layer over the first gate structure and the second gate structure; and
    a through-substrate contact extending through the ILD layer, between the first active region and the second active region, and through the backside dielectric layer,
    wherein the through-substrate contact is spaced apart from the backside dielectric layer by a bottom epitaxial semiconductor layer.

18. The semiconductor device of claim 17,
    wherein the first active region comprises a first vertical stack of nanostructures,
    wherein the second active region comprises a second vertical stack of nanostructures,
    wherein the first gate structure wraps around each of the first vertical stack of nanostructures, and
    wherein the second gate structure wraps around each of the second vertical stack of nanostructures.

19. The semiconductor device of claim 18, wherein the through-substrate contact is spaced apart from sidewalls of the first vertical stack of nanostructures and the second vertical stack of nanostructures by an epitaxial semiconductor layer.

20. The semiconductor device of claim 19, wherein the through-substrate contact comprises:
    an adhesion layer interfacing the epitaxial semiconductor layer by way a silicide layer; and
    a metal fill layer over the adhesion layer.

* * * * *